Feb. 20, 1968 D. J. MARTIN 3,370,249

OSCILLATOR TUNING ARRANGEMENTS

Filed Aug. 25, 1965

United States Patent Office 3,370,249

Patented Feb. 20, 1968

3,370,249

OSCILLATOR TUNING ARRANGEMENTS

David J. Martin, Cowplain, England, assignor to The Plessey Company Limited, Ilford, England, a British company Filed Aug. 25, 1965, Ser. No. 482,579
Claims priority, application Great Britain, Sept. 4, 1964, 36,431/64
3 Claims. (Cl. 331—11)

ABSTRACT OF THE DISCLOSURE

An oscillator tuning arrangement having frequency and phase comparators for comparing the frequencies and phase of slave and reference oscillator outputs, the output from the phase comparator being fed to voltage level discriminators which respond to effect coarse tuning of the slave oscillator to keep the phase relationship between the oscillator outputs within predetermined limits.

This invention relates to oscillator tuning arrangements especially suitable for use in frequency synthesisers.

In frequency synthesisers the frequency of the output from a variable frequency slave oscillator may be controlled in accordance with error signals derived from a comparison made between the slave oscillator output and a standard frequency signal. To this end a slave oscillator output may be fed to a divider (e.g., variable divider) the output from which is applied to frequency and phase comparators. These comparators serve for comparing the frequencies and phases, respectively, of the oscillator output and a reference signal. A difference in frequency between the signals compared results in an error signal being produced by the frequency comparator which is applied to a servo system for effecting coarse tuning of the slave oscillator. The phase comparator on the other hand, provides an error signal representative of phase difference and this signal may be applied to a variable capacitance diode in the slave oscillator for the purpose of effecting fine tuning of the oscillator.

According to the present invention the voltage output from the phase comparator is applied to voltage level detecting means which affords an output responsively to the voltage output exceeding predetermined values which is fed to the servo system for effecting coarse tuning control of the oscillator.

In this way the frequency of the slave oscillator can be kept within predetermined limits of phase relationship with the reference signal and so prevent phase drift taking the oscillator out of a phase lock range consequent upon the phase error voltage falling to zero.

Figure 1:
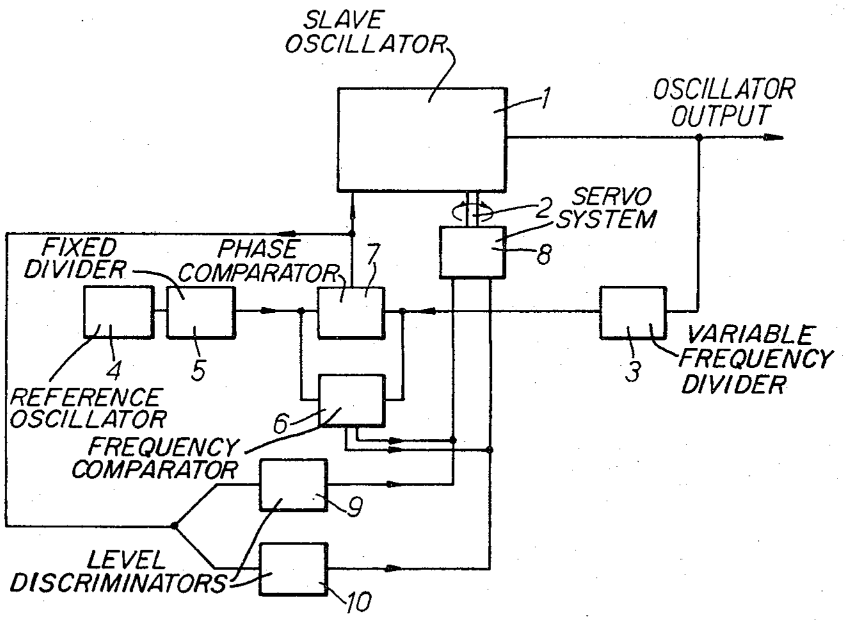
Figure 2:
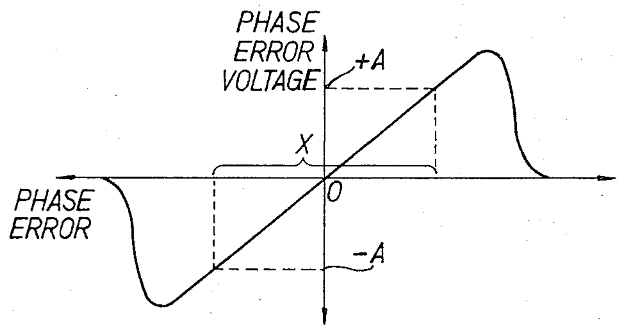

For a better understanding of the invention reference will now be made to the accompanying drawing in which:

FIGURE 1 is a block schematic diagram of a frequency synthesiser according to the present invention, and FIGURE 2 is a diagram illustrating the improved phase control achieved according to the invention.

Referring to FIGURE 1, a variable frequency slave oscillator 1 has a coarse tuning arrangement which includes a variable inductor or capacitor having a spindle shown diagrammatically at 2. The output from the oscillator 1 is fed into a variable frequency divider 3. A reference oscillator 4 feeds a standard frequency signal into a fixed divider 5. The output from this divider and the output from the variable divider 3 are applied to a frequency comparator 6 and a phase comparator 7 connected in parallel. The frequency comparator may comprise, for example, a bi-stable circuit arrangement having gates associated with it and providing an output the magnitude and sense of which signifies the difference in frequency between the reference and the variable oscillator output signals. This output is applied to a servo system 8 which may include a stepping motor for appropriate driving of the oscillator coarse tuner spindle 2. The phase comparator which samples the input signals applied to it has its output applied to a variable capacitance diode in the variable oscillator circuit in order to effect fine tuning of the oscillator output frequency.

Referring now to FIGURE 2, this diagram shows phase error voltage plotted against phase error. As can be seen from the figure the error voltage falls to zero resulting in loss of phase control if the phase error exceeds certain limits. In order to avoid this possibility of loss of control the coarse tuning control of the synthesiser is operated from time to time whenever the phase error voltage exceeds positive and negative values +A and −A, say, so as to reduce the phase error to substantially zero. This ensures that the phase difference between the signals is maintained within the range indicated at X. To achieve this, the error voltage derived from the phase comparator is passed to level discriminators 9 and 10 conveniently comprising Schmitt trigger circuits and timing elements such as monostable circuits arranged for responding respectively to incoming voltages of predetermined magnitudes and opposite polarities (e.g., voltages +A and −A). The level discriminators when they respond produce pulsed outputs of predetermined duration dependent upon the timing circuit having a sense effective for producing appropriate operation of the oscillator tuner when such outputs are applied to the servo motor to correct for phase error such that the phase error is reduced substantially to zero.

What I claim is:

1. An oscillator tuning arrangement comprising a slave oscillator having fine and coarse tuning arrangements for changing its frequency, a reference oscillator, a frequency comparator for comparing the frequencies of the slave oscillator and reference oscillator to provide a frequency error signal dependent upon the frequency difference between the two oscillators, a servo-system to which the frequency error signal is applied for effecting coarse tuning of the slave oscillator, a phase comparator for comparing the phase of the slave oscillator signal and the reference oscillator signal to provide a phase error signal dependent upon the phase difference between the two oscillator signals, said phase error signal being applied to the slave oscillator to effect fine tuning thereof, and voltage level detecting means to which the phase error signal is also applied effective for producing an output signal of predetermined duration when the phase error signal exceeds a predetermined value, said output signal being applied to the servo-system to effect coarse tuning of the slave oscillator.

2. A frequency synthesiser as claimed in claim 1, in which the voltage level detecting means comprises first and second Schmitt trigger circuits and timing elements arranged to respond to incoming voltages of predetermined magnitudes and opposite polarities respectively, to provide output pulses of predetermined duration.

3. A frequency synthesiser as claimed in claim 2, in which the timing elements comprise monostable circuits connected in the output circuit of the first and second Schmitt trigger circuits.

References Cited

UNITED STATES PATENTS 3,218,571 11/1965 Shannon et al. ______ 331—11 X

ROY LAKE, *Primary Examiner.*

NATHAN KAUFMAN, *Examiner.*

J. B. MULLINS, *Assistant Examiner.*